United States Patent [19]

Schüett et al.

[11] Patent Number: 4,985,650
[45] Date of Patent: Jan. 15, 1991

[54] PROGRAMMABLE LOGIC CIRCUIT HAVING BIDIRECTIONAL DATA LINES

[75] Inventors: Dieter Schüett; Winfried Glaeser, both of Munich, Fed. Rep. of Germany

[73] Assignee: Siemens Aktiengesellschaft, Berlin and Munich, Fed. Rep. of Germany

[21] Appl. No.: 415,255

[22] PCT Filed: May 5, 1988

[86] PCT No.: PCT/DE88/00272
§ 371 Date: Sep. 6, 1989
§ 102(e) Date: Sep. 6, 1989

[87] PCT Pub. No.: WO88/09996
PCT Pub. Date: Dec. 15, 1988

[30] Foreign Application Priority Data

Jun. 6, 1987 [DE] Fed. Rep. of Germany ....... 3718915

[51] Int. Cl.⁵ .......................................... H03K 19/177
[52] U.S. Cl. .................................. 307/465; 307/243; 307/443; 340/825.83
[58] Field of Search ................... 307/202.1, 443, 475, 307/465–469, 242–243; 340/825.79, 825.83, 825.85–825.87; 365/189.08

[56] References Cited

U.S. PATENT DOCUMENTS

| | | | |
|---|---|---|---|
| 3,816,725 | 6/1974 | Greer | 307/465 X |
| 4,293,783 | 10/1981 | Patil | 307/465 |
| 4,467,439 | 8/1984 | Rhodes | 340/825.87 X |
| 4,506,341 | 3/1985 | Kalter et al. | 307/465 X |
| 4,554,640 | 11/1985 | Wang et al. | 307/465 X |
| 4,667,181 | 5/1987 | Hastreiter | 340/825.79 X |
| 4,740,919 | 4/1988 | Elmer | 307/202.1 X |
| 4,910,508 | 3/1990 | Yamazaki | 307/465 X |
| 4,918,440 | 4/1990 | Furtek | 340/825.79 X |

FOREIGN PATENT DOCUMENTS 60-145726 8/1985 Japan.

OTHER PUBLICATIONS

Varadarajan, "Universal Logic Array", *IBM TDB*, vol. 20, No. 1, Jun. 1977, pp. 189–190.
Weiss, Horninger, "Integrierte MOS-Schaltungen", Springer Verlag, pp. 295–298.
Electronique et Microelectronique Industrielles, Nr. 215, Feb. 15, 1976, (Paris Fr), H. Lilen: "Qu'est-ce qu'un reseau logique programmable (PLA)?", pp. 19–24 see FIGS. 3, 4.

*Primary Examiner*—David Hudspeth
*Attorney, Agent, or Firm*—Hill, Van Santen, Steadman & Simpson

[57] ABSTRACT

The logical operation of binary input signals can be carried out with a programmable circuit arrangement. It contains a matrix (MA) of crossing data lines (DL) and coupling lines (KL) at whose coupling locations switching elements (KE) are arranged corresponding to a function table to be realized. The switching elements (KE) can assume three statuses: one status corresponds to a binary 1 and the second status corresponds to a binary 0; the third status corresponds to a binary 1 or to a binary 0. Every data line (DL) can be operated as input or as output with the assistance of a control signal (ST) that is supplied to an input circuit and to an output circuit (AG). The input signals coupled from the data lines operated as input onto a coupling line (KL) are subjected to an AND operation on the coupling line. By contrast, the signals coupled from the coupling lines (KL) onto a data line (DL) wired as output are subjected to an OR operation on the data line. Dependent on the statuses set in the switching elements (KE) in accord with a function table, various operations can be executed in that data lines (DL) are operated as input or as output.

11 Claims, 5 Drawing Sheets

PROGRAMMABLE LOGIC CIRCUIT HAVING BIDIRECTIONAL DATA LINES

BACKGROUND OF THE INVENTION

The invention is directed to a programmable arrangement for operating binary input signals upon employment of a matrix that is composed of data lines, of coupling lines crossing therewith and of coupling elements arranged at the coupling points of the data lines and coupling lines.

Programmable circuits, abbreviated as PLA, are known (see, for example, Weiss, Horninger, Integrierte MOS-Schaltungen, Springer-Verlag 1982, pages 295 through 298). Such programmable circuits contain an AND level and an OR level. The operation of the input signals according to a function table stored in the AND level ensues in the AND level. These operation results of the AND level that are also referred to as product terms are supplied to the OR level and are operated there according to the function table contained in the OR level to form what are referred to as sum terms. The sum terms are output at the outputs of the OR level. Such a PLA has input lines that lead to the AND level and output lines that lead out from the OR level available to it.

SUMMARY OF THE INVENTION

The object underlying the invention is comprised in constructing a programmable circuit arrangement such that it can be bidirectionally operated; i.e., the lines (data lines) entering into the programmable circuit arrangement can be input lines or output lines.

In a programmable circuit arrangement of the species initially cited, this object is achieved by the characterizing features of patent claim 1.

The programmable circuit arrangement is thus no longer composed of a separately executed AND level and OR level. On the contrary, it is composed of a matrix of crossing data lines and coupling lines and of switching elements arranged according to a function table at the coupling points between the data lines and the coupling lines. Dependent on a control signal, the data lines can be operated as input line or as output line. The coupling lines are terminated such that the input signals coupled from the data lines operated as input lines onto the coupling lines are subject to an AND operation. The data lines are terminated such that, given operation as output line, the signals coupled in from the coupling lines are subjected to a OR operation.

The switching elements are executed such that a function table having a trivalent logic can be stored. Further, there are four possibilities of how the output value of a data line operated as output line can be determined. The user can select one of the four possibilities. The plurality of logic functions can be realized in such a universally constructed programmable circuit without additional function lines.

Improvements of the invention derive from the subclaims.

BRIEF DESCRIPTION OF THE DRAWINGS

The invention shall be set forth in greater detail with reference to exemplary embodiments that are shown in the figures. Shown are.

DESCRIPTION OF THE PREFERRED EMBODIMENT

A logic function can be expressed by the disjunctive normal form; for example, the output variables derive in the form $YO = \overline{X1}\,X2 + X1\,\overline{X2}$, $Y1 = X1X2\,\overline{X}$ is thereby the inverted X.

The function table for this function reads:

| X1 | X2 | Y0 | Y1 |
|----|----|----|----|
| 0  | 0  | 0  | 0  |
| 0  | 1  | 1  | 0  |
| 1  | 0  | 1  | 0  |
| 1  | 1  | 0  | 1  |

The function can be realized in that the required AND operation is produced and the OR operation is formed therefrom. This can be achieved with the assistance of a programmable circuit arrangement in that the required connections between the input variables or, respectively, their negations and a plurality of AND elements are produced in a matrix by simple connecting of crossing lines. The connection between the AND elements and the OR elements is then produced in a second matrix. Such an arrangement is known as a programmable logical field or programmable logic array, PLA.

Figure 1:
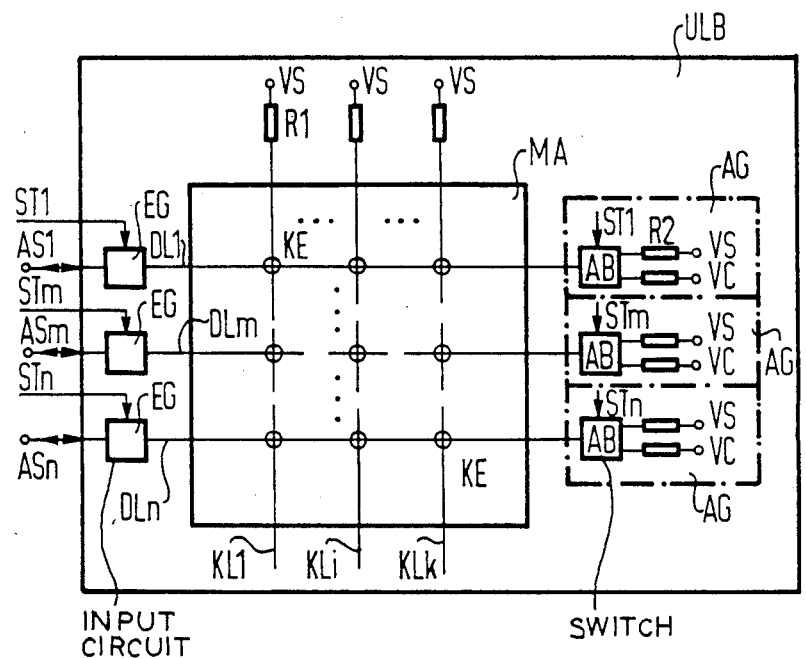
FIG. 1 a block circuit diagram of the programmable circuit arrangement.

Such a logical operation of input variables corresponding to a function table can also be executed with the assistance of the programmable circuit arrangement of FIG. 1. The programmable circuit arrangement ULB is composed of a matrix MA of crossing data lines DL and coupling lines KL. Switching elements KE are arranged at the crossing locations, a connection between the data lines DL and coupling lines KL being capable of being produced via these switching elements KE. The switching elements KE are executed such that three statuses can be stored by them namely a binary 0 binary 1 or a third status (*).

The asterisk notation (*) refers to a don't care status wherein the status can either be a binary 0 or a binary 1. This indicates operations in which the status is not taken into consideration. The coupling lines are connected to a first operating voltage source VS via a resistor R1. The data lines DL are connected via a switch over means AB and resistors R2 either to the first operating voltage source VS or to a second operating voltage source VC. The switch over means AB, the resistors R2 and the operating voltage sources form an output circuit AG. An input circuit EG that is controlled by control signals ST is provided at the input of the data lines DL. The assistance of the control signals ST can be used to determine whether the data lines DL are operated as input line or as output line, i.e. whether the terminal AS of the data line DL is an input or an output. Upon employment of the control signal ST, the switch over means AB correspondingly switches the data line either to the first operating voltage source VS or to the second operating voltage source VC.

When data lines DL are operated as input lines, then input signals on these data lines are transferred onto the coupling lines KL corresponding to the adjustment of the switching elements KE and are subjected to an AND operation there. A coupling signal thereby arises on every coupling line KL, this coupling signal, corresponding to switching elements KE arranged between a data line DL operated as output line and the coupling lines KL, being coupled back onto this data line and being subjected to an OR operation there.

When, for example, the data lines DL1 and DLm are operated as input lines by applying the control signal ST1 and STm and, thus, the data lines DL1 and DLm are connected to the first operating voltage source VS by the switch over means AB, then input signals at the terminals AS1, ASm of the data lines DL1, DLm are coupled into the coupling lines KL1, KLi and KLk corresponding to the setting of the switching elements KE. The input signals are subjected to an AND operation therein. When the data line DLn is operated as output line and, thus, is connected to the second operating voltage source VC via the switch over means AB, then the coupling signals that have arisen on the coupling lines KL1, KLi, KLk due to the AND operation of the input signals are coupled back onto the data line DLn via the switching elements KE arranged between the output line DLn and the coupling lines in accord with the setting of these switching elements KE and are subjected to an OR operation there. The value of the OR operation is output at the output ASn.

The advantage of this programmable circuit arrangement ULB is thus comprised therein that every data line DL1, DLm, DLn can be operated either as input or as output and that a function table for operating the input signals with the assistance of a trivalent setting of the switching elements KE can be stored in the matrix MA.

In order to be able to execute a specific logic function, thus, a function table or a portion of a function table must be stored in the matrix with the assistance of three statuses 0, 1, *. A column in the function table and, moreover, a control terminal are present for every terminal AS. The function that is to be realized in the programmable circuit arrangement ULB is selected by determining the inputs and outputs.

The following declarations can thereby be undertaken:

The value * in the function table is valid as binary 0 or binary 1 upon comparison to the input signal pattern. This is referred to as Condition 1.

The value * is not taken into consideration in the determination of the output value. This is Condition 2.

Only the active rows are considered in the determination of the output value. Active rows are the rows that coincide with the input pattern.

The programmable circuit arrangement then operates in the following way:

The control signals ST are used to determine which terminals AS should operate as input or as output.

A bit pattern is applied to the terminals AS that are wired as input.

Internally, the input bit pattern is compared to all rows of the function table in the matrix of the programmable circuit arrangement.

The rows that coincide with the input bit pattern remain active. Condition 1 is thereby to be taken into consideration.

In order to determine the output value at the data line wired as output, the allocated column of the function table is analyzed. The Conditions 2 and 3 must thereby be taken into consideration. The value * is thus not taken into consideration and only active table rows are considered. In order to determine the output value, the user can thereby select from among four possibilities:

The first possibility is that an output value X (i) is only binary 1 in case at least one 1 is present in the row i of the function table; only the active rows are thereby considered. The value * is thereby not taken into consideration, it is valid as 0.

The second possibility is that the output value X (i) is only 0 in case at least one 1 is present in table column i; only the active rows are thereby considered. Here, too, the value * is not taken into consideration.

The third possibility is comprised therein that the output value X (i) is only one in case at least one 0 is present in the function table i; only the active rows are thereby taken into consideration. The value * is likewise not taken into consideration.

The fourth possibility is that the output value X (i) is only 0 in case at least one 0 is present in the function column i; only the active rows are thereby considered Here, too, the value * is not taken into consideration.

The principle of the programmable circuit arrangement ILB shall be set forth in greater detail with reference to an example. The following function table forms the basis: Row Number of the Function Table X1, X2, X3, X4, X5

| Row Number of the Function Table | X1 | X2 | X3 | X4 | X5 |
|---|---|---|---|---|---|
| 1 | 0 | 1 | 0 | 0 | * |
| 2 | 1 | 0 | 1 | 0 | 1 |
| 3 | * | * | 0 | 0 | * |
| 4 | * | * | 0 | 1 | * |

Let this table be stored in the programmable circuit arrangement. Let X1 and X2 be connected as input X3 through X5 as output. When the input bit pattern X1=0 and X2=1 is adjacent at ULB, then the rows 1, 3 and 4 remain active (* denotes 0 or 1 corresponding to Condition 1). Row 2, namely, does not satisfy the input bit pattern X1=0 and X2=1. When the above-recited possibility 1 is selected, the values are calculated in the following way: in order to calculate X3=f (X1, X2), the third column of the function table is considered. Since the second row drops out and the remaining rows are 0, X3 becomes equal to 0.

In order to calculate X4=f (X1, X2), the fourth column of the function table is considered The second row again drops out since it is not active. A 1 is present in the column of the function table for X4; X4 thus becomes equal to 1.

X5=f (X1, X2) is correspondingly calculated. The fifth column of the function table is thereby considered. The second row again drops out; the remaining values of the column are *. Since the value * is not taken into consideration in the determination of the output value, no 1 is present in the column; X5 becomes equal to 0, The assistance of a further example shall be used to show that an EXNOR element can be made into an AND element by a different allocation of the inputs and outputs of the programmable circuit arrangement given storage of a defined function table. Let the stored function table be:

| X1 | X2 | X3 |
|----|----|----|
| 0  | 0  | 1  |
| 1  | 1  | 1  |

When X1 and X2 are wired as input and X3 is wired as output, the following function derives for X3=f (X1, X2):

| X1 | X2 | X3 |
|----|----|----|
| 0  | 0  | 1  |
| 0  | 1  | 0  |
| 1  | 0  | 0  |
| 1  | 1  | 1  |

This table shows that the input signals X1 and X2 are subjected to an EXNOR operation for the case X3=f (X1, X2).

When, by contrast, X1 is selected as output and X2, X3 are selected as inputs, i.e. X1=f (X2, X3), then the following table derives:

| X2 | X3 | X1 |
|----|----|----|
| 0  | 0  | 0  |
| 0  | 1  | 0  |
| 1  | 0  | 0  |
| 1  | 1  | 1  |

We now have an AND operation of the input signals X2 and X3 at the output X1.

There are two possibilities for storing the function tables in the programmable circuit arrangement ULB: The circuit arrangement is programmed via a mask during the manufacturing process. This method is suitable for high item numbers and has the advantage that a larger function table can be stored. Or the customer programs the circuit arrangement with a programming means.

Figure 2:
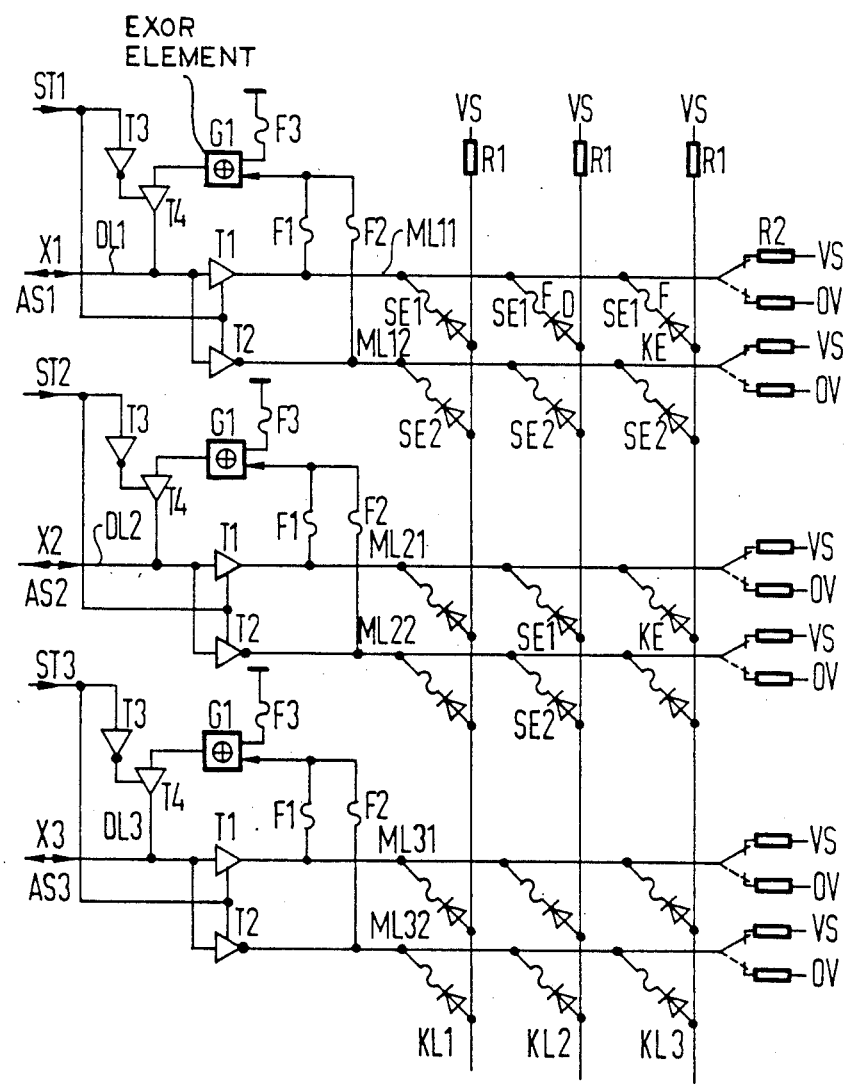
FIG. 2 a wiring diagram of the programmable circuit arrangement.

A wiring diagram of the programmable circuit arrangement shall be set forth with reference to FIG. 2. Three data lines DL1, DL2 and DL3 and three coupling lines KL1, KL2 and KL3 are shown. These data lines DL1 through DL3 have terminals AS1 through AS3 on which the signals X1 through X3 are present. Every data line DL1 through DL3 branches into two matrix lines ML. The data line DL1 into the matrix lines ML11, ML12; the data line DL2 into the matrix lines ML21, ML22; and the data line DL3 into the matrix lines ML31 and ML32. The matrix lines ML are combined by the input circuit EG to form a data line DL. The input circuit EG is set such with the assistance of a control signal ST that the corresponding data line is operated either as input or as output.

Figure 3:
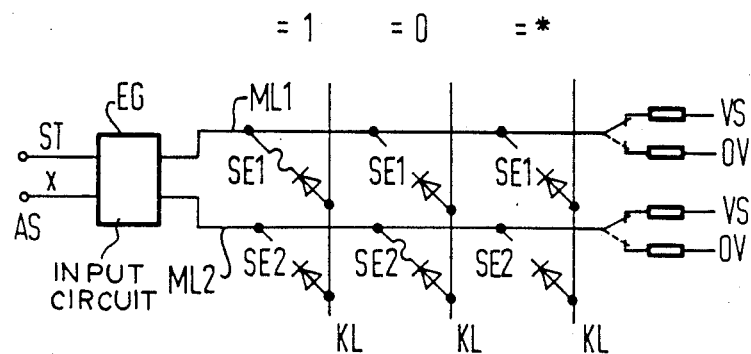
FIG. 3 the programming of the switching elements.

For storing a function table, the switching elements KE are composed of two disconnectable logic elements SE1, SE2. The logic elements SE are shown as a diode path composed of a diode D and of a fuse F. A logic element SE can be disconnected by blowing the fuse F. A switching element can then be set with the assistance of the logic elements SE per switching element. FIG. 3 shows the possible settings. When a binary 1 is to be set, then the logic element SE1 lies between the matrix line ML1 and the coupling line KL; the logic element SE2 is disconnected. When a binary 0 is to be set, then the logic element SE is present between the matrix line ML2 and the coupling line KL, whereas the logic element SE1 between the first matrix line ML1 and the coupling line KL is disconnected. When, finally, the status * is to be set, then the logic elements SE1, SE2 between the matrix lines ML1, ML2 and the coupling line KL are disconnected.

Figure 4:
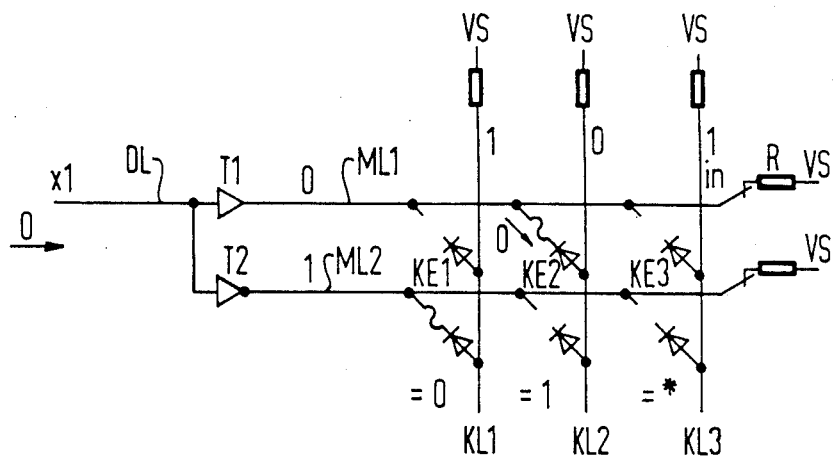
FIG. 4 a portion of the circuit arrangement wherein a data line is operated as input.

When a data line DL is to be operated as input, then the input circuit EG and the output circuit AG are operated in accord with FIG. 4 with the assistance of the control signal ST, i.e. only one driver stage T1 and inverting driver stage T2 are in operation in the input circuit EG, whereas the remaining elements of the input circuit EG are disconnected. The switch over means AB is set such at the output circuit that the matrix lines ML1, ML2 are connected to the first operating voltage source VS. Let a binary 0 be stored in the switching element KE1, a binary 1 be stored in the switching element KE2 and an * stored in the switching element KE3. When a binary 0 is then selected as input signal, the binary 0 lies on the matrix line ML1 and the binary 1 lies on the matrix line ML2. The input signal X1 can then not act on the coupling line KL1; the coupling line KL1 retains its logical status "1". By contrast, the binary 0 on the matrix line ML1 can proceed via the switching element KL2 onto the coupling line KL2; the coupling line KL2 becomes binary 0. Since both logic elements are interrupted at the switching element KL3 the status on the coupling line KL3 is retained, i.e. binary 1. It can be seen that the binary status of the coupling lines only changes when X1 is binary 0. This corresponds to an AND operation of the input signals on the coupling lines.

Figure 5:
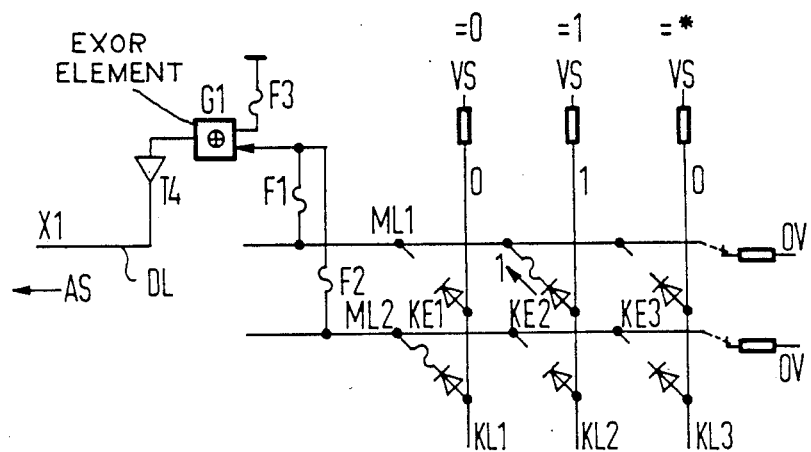
FIG. 5 a portion of the circuit arrangement wherein a data line is operated as output.

A portion of the programmable circuit arrangement ULB when a data line is wired as output derives from FIG. 5. Only those parts of the input circuit EG and of the output circuit AG that are active in this operating mode are again shown. Due to the control signal ST, the driver stages T1, T2 are now disconnected and only the driver stage T4 and an EXOR element G1 are effective. This EXOR element G1 is connected to the matrix line ML1 via a switch F1, to the matrix line ML2 via a switch F2 and to fixed potential via a switch F3. The output circuit AG is set such that the matrix lines ML are connected to the operating voltage source VC, for example 0 volts, via the resistor R2. For example, VS is 5 volts.

Let the recited binary signals be present on the coupling lines KL1, KL2, KL3 whose allocated switching elements KE1, KE2, KE3 are set in accord with FIG. 5. The binary 1 can proceed from the coupling line KL2 to the matrix line ML1 only via the switching element KE2. Nothing is coupled over from a coupling line onto a matrix line ML via the switching elements KE1, KE3. Accordingly, a binary 1 is established on the matrix line ML1; the binary 0 remains on the matrix line ML2. Given activated switching element KE, a binary 1 on a coupling line KL thus penetrates to the matrix line ML connected to the coupling line KL. This corresponds to an OR operation.

In accord with the setting of the switches F1, F2, F3, the signals on the matrix lines ML can be conducted through to the output AS as signal X1: When the switch F2 is turned off and the switch F1 is turned on, then there are two possibilities: Let the switch F3 be turned on; the binary 1 on the matrix line ML1 then penetrates to the output AS.

Let the switch F3 be turned off; then a binary 0 is output as signal X1 when a binary 1 is present on the matrix line ML1.

There are two possibilities when the switch F1 is turned off and the switch F2 is turned on: Let the switch F3 be turned on; then a binary 1 on the matrix line ML2 penetrates to the output AS.

When, by contrast, the switch F3 is turned off, then a binary 0 is output at the output AS as signal X1 when a binary 1 is present on the matrix line ML2. With the assistance of the switches F1, F2, F3, thus, either the signal on the first matrix line ML1 or on the second matrix line ML2 can be through-connected to the output AS influenced or uninfluenced.

Figure 6:
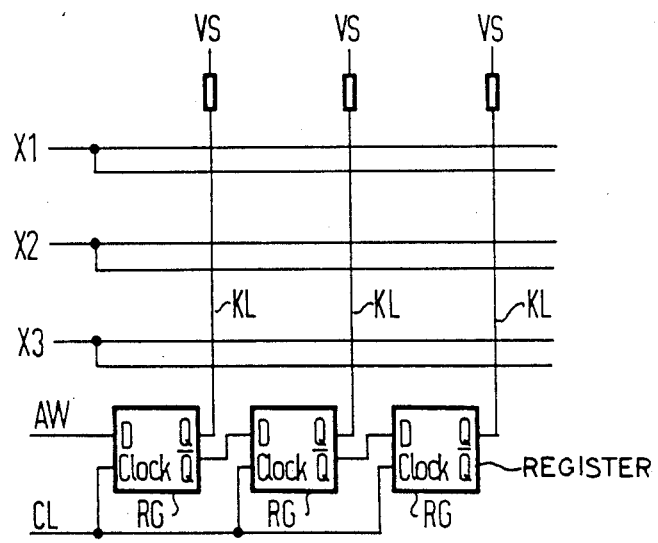
FIG. 6 an auxiliary circuit with which the coupling lines can be disconnected.

When, according to FIG. 6, the coupling line KL is connected to a register RG, then it is possible to disconnect every coupling line KL. When the output of the register RG is applied to 0, then the corresponding coupling line KL is disconnected and can no longer influence a matrix line ML. For the function table, this means that a row of the function table is deleted. In the exemplary embodiment of FIG. 6, the registers RG are wired as shift registers, so that a selection signal AW can be shifted through the registers RG dependent on a clock signal CL.

Figure 7:
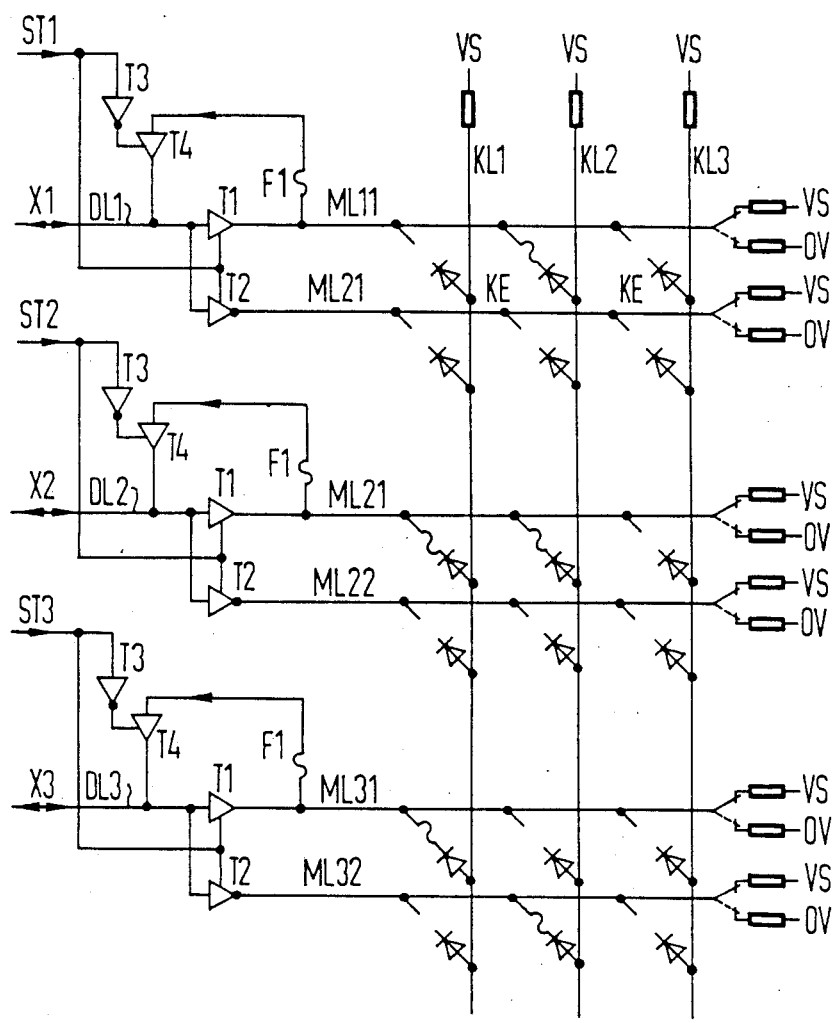
FIG. 7 a programmed circuit arrangement.

FIG. 7, finally, shows a programmed circuit arrangement. The following function table is stored in the matrix

| X1 | X2 | X3 |
|----|----|----|
| *  | 1  | 1  |
| 1  | 1  | 0  |

The setting of the matrix ensues according to FIG. 3. The last column, namely the coupling line KL3, was not used for storing.

Three different functions can be realized by setting the control signals ST dependent on which data line DL is selected as output.

First case:

| X1 | X2 | X3 |
|----|----|----|
| 0  | 0  | 0  |
| 0  | 1  | 1  |
| 1  | 0  | 0  |
| 1  | 1  | 1  |

Second case: X1 = f (X2, X3) yields the following table:

| X2 | X3 | X1 |
|----|----|----|
| 0  | 0  | 0  |
| 0  | 1  | 0  |
| 1  | 0  | 1  |
| 1  | 1  | 0  |

Third case: X2 = f (X1, X3) yields the following table:

| X1 | X3 | X2 |
|----|----|----|
| 0  | 0  | 0  |
| 0  | 1  | 1  |
| 1  | 0  | 1  |
| 1  | 1  | 1  |

In the exemplary embodiment of FIG. 7, the switches F1 and F3 are closed and only the switch F2 is opened; the operation result is thus connected through to the output on the upper matrix lines.

Logic elements SE in the exemplary embodiments are realized as diode D and fuse F. Other realizations are possible; for example, conductive connections between the matrix lines and the diodes can already be provided during the manufacturing process.

The advantages of the programmed circuit arrangement of the invention may be seen from the following: The number of modules that such a programmed circuit arrangement contains is reduced to a few, universal modules. The function that the module is to realize is defined by the determination of the inputs and outputs. The plurality of rows stored in the ULB is low since trivalent logic is internally used in the ULB. When no time-critical events are present, the ULB can sequentially realize a plurality of functions. Modules on the mother board or cells in the gate array can thereby be eliminated.

The functions that the ULB should realize are prescribed in practice. A function table that is composed of optimally few rows and columns must be generated with the skillful selection of the outputs.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

We claim:

1. Programmable circuit arrangement for logically processing binary input signals upon employment of a matrix that is composed of data lines, of coupling lines crossing therewith and of switching elements arranged at the coupling locations of the data lines and coupling lines, comprising:
   every data line being an input or output dependent on a control signal on a control line operatively connected to the data line;
   every switching element being programmable and having three possible statuses;
   every coupling line terminated by associated first means for terminating such that input signals coupled from the data lines, operated as input lines, onto the coupling line are subjected to an AND operation;
   every data line terminated by associated second means for terminating such that, given operation as an output line, coupling signals coupled in from the coupling lines are subjected to an OR operation.

2. Programmable circuit arrangement according to claim 1, wherein the switching elements are programmed according to the operation of the input signals to be achieved and are thereby set either as binary 0 status, or as binary 1 status or as a don't care status.

3. Programmable circuit arrangement according to claim 2, wherein every data line branches into first and second matrix lines whereof one carries the signal that is present on the data line and the other carries this signal in inverted form.

4. Programmable circuit arrangement according to claim 3, wherein every switching element is composed of two disconnectable unidirectional diode paths whereof the one is coupled between one matrix line of a data line and a coupling line and the other is coupled between the other matrix line of this data line and the coupling line.

5. Programmable circuit arrangement according to claim 4, having the following programming of a switching element:
   for setting a first status of a binary 1 status, the one matrix line is connected to the coupling line via the associated diode path and the other matrix line is disconnected from the coupling line via the associated diode path;
   for setting a second status of a binary 0 status, the one matrix line is disconnected from the coupling line via the associated diode path and the other matrix line is connected to the coupling line via the associated diode path;
   for setting a third status of a don't care status, both matrix lines are disconnected from the coupling line via the respective associated diode paths.

6. Programmable circuit arrangement according to claim 5, wherein each matrix line is connected via a switch controlled by the control signal and via a resistor either to a first operating potential given operation of the data line as input or to a second operating potential given operation of the data line as output.

7. Programmable circuit arrangement according to claim 6, wherein each coupling line is connected via a further resistor to the first operating potential.

8. Programmable circuit arrangement according to claim 3, wherein an input circuit is coupled in each data line, said input circuit being composed of
   a first driver stage connected between the data line and the one matrix line and having a control input coupled to receive the control signal,
   an inverting driver stage connected between the data line and the other matrix line and having a control input coupled to receive the control signal,
   a third driver stage having a control input coupled to receive the control signal, a further input respectively connected to each matrix line and an output coupled to an input terminal of the data line.

9. Programmable circuit arrangement according to claim 8, wherein a respectively interruptable connection is provided between the matrix lines of a data line and the further input of the third driver stage, so that either the one or the other matrix line is connectable to the terminal of the data line via the third driver stage.

10. Programmable circuit arrangement according to claim 9, wherein an exclusive OR circuit is connected preceding the further input of the third driver stage, the exclusive OR circuit having a first input connected to the matrix lines via the interruptable connections and a second input connected to a selection input via a further interruptable connection.

11. Programmable circuit arrangement according to claim 7, wherein every coupling line is connected to a register for disconnecting the coupling line from a coupling signal.

* * * * *